US008081522B2

(12) United States Patent  
Murakami

(10) Patent No.: US 8,081,522 B2  
(45) Date of Patent: Dec. 20, 2011

(54) PAGE BUFFER CIRCUIT FOR ELECTRICALLY REWRITABLE NON-VOLATILE SEMICONDUCTOR MEMORY DEVICE AND CONTROL METHOD

(75) Inventor: Hiroki Murakami, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 266 days.

(21) Appl. No.: 12/613,993

(22) Filed: Nov. 6, 2009

(65) Prior Publication Data

US 2010/0172181 A1    Jul. 8, 2010

(30) Foreign Application Priority Data

Nov. 6, 2008    (JP) .................................. 2008-285406

(51) Int. Cl.  
*G11C 7/10* (2006.01)
(52) U.S. Cl. .............................. 365/189.05; 365/185.12
(58) Field of Classification Search ............. 365/189.05, 365/185.12  
See application file for complete search history.

(56) References Cited

U.S. PATENT DOCUMENTS 7,379,333 B2 * 5/2008 Lee et al. ................. 365/185.12

FOREIGN PATENT DOCUMENTS

| JP | 9-147582 | | 6/1997 |
| JP | 2000-285692 | A | 10/2000 |
| JP | 2001-028575 | A | 1/2001 |
| JP | 2003-346485 | A | 12/2003 |
| JP | 2006-269044 | | 10/2006 |

* cited by examiner

*Primary Examiner* — Son Dinh  
*Assistant Examiner* — Nam Nguyen  
(74) *Attorney, Agent, or Firm* — Muncy, Geissler, Olds & Lowe, PLLC

(57) ABSTRACT

Within a page buffer 14 which is coupled to a non-volatile memory cell array 10 and temporally stores data as the data with a predetermined page unit is written in and read out to/from the memory cell array 10, at least one latch circuit 14v-1 including a bit line selector 14s, a page buffer unit circuit 14u including two latch L1, L2, and a latch L3 is set up for a plurality of bit lines. The bit line selector 14s selects one bit line and couples it to the page buffer unit circuit 14u. The latch L1 temporally stores the data which are read out from the memory cell of the selected bit line, and then outputs the data through the latch L2 or L3. On the other hand, the latch L1 temporally stores the programming data inputted through the latch L2 or L3, and after that outputs it to the memory cell of the selected bit line for programming.

8 Claims, 20 Drawing Sheets

Prior art
(a) electrical data pattern
(b) readout sequence
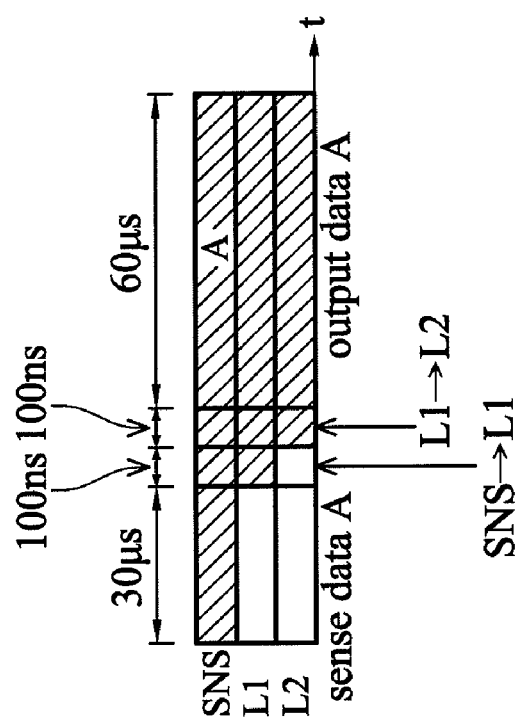
FIG. 6

Embodiment 1
(a) electrical data pattern
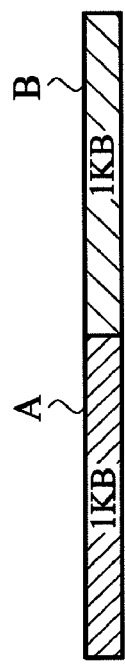
(b) readout sequence
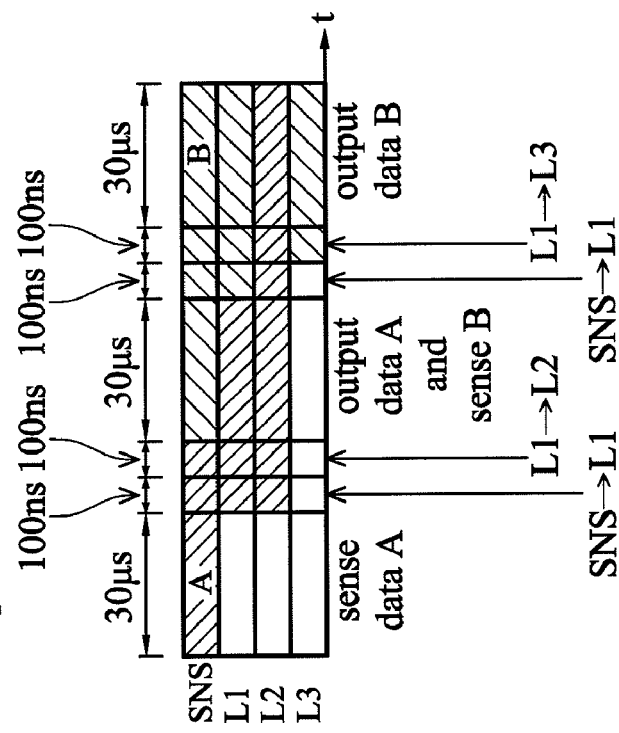
FIG. 7

| | condition of applying to the bit line | | |
|---|---|---|---|
| | readout/verify | programming | erase |
| select | 1.2V | 0V | floating (~25V) |
| unselect | 0V | Vcc | floating (~25V) |

FIG. 17

| page size (byte) | toggle (25nsec/cyc) | readout (upper line) / programming (under line) | total action time of programming (upper line) / total action time of write-in (under line) |
|---|---|---|---|
| 512 | 12.8μsec | 20 μsec / 220 μsec | 32.8 μsec / 232.8 μsec |
| 1024 | 25.6μsec | 30μsec / 330 μsec | 55.6 μsec / 355.6 μsec |
| 2048 | 51.2μsec | 40 μsec / 440 μsec | 91.2 μsec / 491.2 μsec |
| 4096 | 102.4μsec | 50 μsec / 550 μsec | 152.4 μsec / 652.4 μsec |
| 8192 | 204.8μsec | 60 μsec / 660 μsec | 264.8 μsec / 864.8 μsec | action time of data input/output (annotation) programming time = verifying time × 6 + pressing time × 5

FIG. 18

| latch size | L1 | L2 | L3 | L4 | L5 |
|---|---|---|---|---|---|
| prior art (PB size 1) | 2KB | 2 KB | 0 | 0 | 0 |
| embodiment (PB size 1/2) | 1 KB | 1 KB | 1 KB | 1 KB | 1 KB |
| modification (PB size 1/4) | 512B | 512B | 512B | 512B | 512B |

FIG. 19

PAGE BUFFER CIRCUIT FOR ELECTRICALLY REWRITABLE NON-VOLATILE SEMICONDUCTOR MEMORY DEVICE AND CONTROL METHOD

SUMMARY OF THE INVENTION

1. Field of the Invention

The present invention relates to a page buffer circuit for an electrically rewritable non-volatile semiconductor memory device (EEPROM), like a flash memory, etc, and control method thereof.

2. Background of the Invention

A NAND type non-volatile semiconductor memory device (see non-patented documents 1-4) is well known for those skilled in art, which comprises a plurality of memory cell transistors (or so-called memory cells below) connected to between bit lines and source lines forming a NAND string and realizes highly integrating.

For common NAND type non-volatile semiconductor memory devices, when erasing, high voltage, for example 20V, is applied to a semiconductor substrate thereof and no voltage, for example 0V is applied to a word line thereof. Following, electrons are removed form an electric charge storage layer formed by poly-silicon material and so on. The threshold voltage is lower than the erasing threshold value (for example −3V). In the other hand, when writing in (programming), no voltage, for example 0V is applied to a semiconductor substrate thereof and high voltage, for example 20V, is applied to a controlling gate thereof. Following, electrons are injected from the semiconductor substrate to the floating gate. The threshold value is higher than the write-in-threshold value (for example 1V). The memory cell to get these threshold values can determine the state by applying a readout voltage (for example 0V) between the write-in threshold value and the readout threshold value to the control gate and identifying if the current is flowing through the memory cell.

Referring to the flash memory device described in patented document 5, to reduce the number and the size of the Y gate circuit, the memory cells respectively connected to the plurality of bit line pairs are accessed through one page buffer and one Y gate circuit.

Specifically, the flash memory device comprises a memory cell array which is formed by a plurality of memory cells connected to a plurality of corresponding bit lines. Also, page buffer circuits which are coupled to the bit line pairs set among the plurality of bit lines correspondingly, wherein when in a readout action, each page buffer circuit responses to any one of the transmitting control signals and the latch control signal, orderly and continuously memorizes the sense data corresponding to the readout data received by one part of the set bit line pairs, and then responses to any one of the transmitting control signals, orderly, and continuously outputs the memorized data to one of the inner input/output lines; Y gate circuits which are connected to the respective page buffer through the inner input/output lines correspondingly, wherein each Y gate circuit responses to any one of the input/output control signals and connects or disconnects one of the inner input/output lines with a data input/output line; a Y decoder which responses to the column address signal and the readout command or the programming command and generates the transmitting control signal and the input/output signal.

Patented document 1 JP H09-147582;
Patented document 2 JP 2000-285692;
Patented document 3 JP 2003-346485;
Patented document 4 JP 2001-028575; and
Patented document 5 JP 2006-269044.

However, although the flash memory device described in the prior art of the patented document 5 can reduce programming time but cannot reduce the size of the page buffer circuits.

Following the miniaturization of the flash memory, there comes a problem about that the area of the page buffer expands. Especially in contrast to the miniaturization of the flash memory, the transistors within the page buffer have a miniaturization limit for practicing its function.

The invention provides a page buffer for a non-volatile semiconductor memory device and the control method thereof to solve the above mentioned deficiencies and substantially reduce the size of the page buffer in comparison with the prior art.

SUMMARY OF THE INVENTION

With regard to the first invention, a page buffer circuit for a non-volatile semiconductor memory device which is coupled to a non-volatile memory cell array and temporally stores data therein as the data with a predetermined page unit is written in and read out to/from the memory cell array. The page buffer comprises at least one latch circuit including a bit line selector, a page buffer unit circuit including a first latch and a second latch, and a latch L3, for a plurality of bit lines, wherein the bit line selector selects one of the plurality of bit lines and couples it to the page buffer unit circuit. Also, The page buffer comprises a control circuit, wherein the control circuit controls so that the first latch temporally stores the data which is read out from the memory cell of the selected bit line, and then outputs the data through the second latch or the third latch; on the other hand, the first latch temporally stores the programming data inputted through the second latch or the third latch, and then outputs it to the memory cell of the selected bit line for programming.

Within the page buffer circuit for a non-volatile semiconductor memory device, the control circuit performs outputting a first data read out from the memory cell of the selected bit line from the first latch to the second latch and sensing a second data from a memory cell of the next selected bit line at the same time.

Additionally, within the page buffer circuit for a non-volatile semiconductor memory device, the control circuit performs outputting a stored first programming data from the first latch to the memory cell of the selected bit line for programming and inputting an inputted second programming data to the third latch at the same time.

Additionally, within the page buffer circuit for a non-volatile semiconductor memory device, the control circuit performs programming a first programming data and a second programming data at the same time after the stored first programming data is set to the selected bit line and the stored second programming data is set to the next selected bit line.

With regard to the second invention, a control method of a page buffer circuit for a non-volatile semiconductor memory device, wherein the page buffer circuit is coupled to a non-volatile memory cell array and temporally stores data as the data with a predetermined page unit is written in and read out to/from the memory cell array. The control method comprises setting at least one latch circuit including a bit line selector, a page buffer unit circuit including a first latch and a second latch, and a latch L3, for a plurality of bit lines, wherein the bit line selector selects one of the plurality of bit lines and couples it to the page buffer unit circuit; controlling so that the first latch temporally stores the data which is read out from the memory cell of the selected bit line, and then outputs the data through the second latch or the third latch; on the other hand, the first latch temporally stores the programming data inputted through the second latch or the third latch, and after that outputs it to the memory cell of the selected bit line for programming.

Additionally, within the control method of a page buffer circuit for a non-volatile semiconductor memory device, outputting a first data read out from the memory cell of the selected bit line from the first latch to the second latch and sensing a second data from a memory cell of the next selected bit line are implemented at the same time.

Additionally, within the control method of a page buffer circuit for a non-volatile semiconductor memory device, outputting a stored first programming data from the first latch to the memory cell of the selected bit line for programming and inputting an inputted second programming data to the third latch are implemented at the same time.

Additionally, within the control method of a page buffer circuit for a non-volatile semiconductor memory device, programming a first programming data and programming a second programming data are implemented at the same time after the stored first programming data is set to the selected bit line and the stored second programming data is set to the next selected bit line.

In summary, according to the page buffer circuit for a non-volatile semiconductor memory device and the control circuit thereof, at least one latch circuit including a bit line selector, a page buffer unit circuit including a first latch and a second latch, and a third latch is set up for a plurality of bit lines. Thus, in comparison with the prior art, the invention can substantially reduce the size of the page buffer circuit within almost the same action time.

DETAILED DESCRIPTION OF THE PREFERRED EMBODIMENTS

The embodiments of the invention are described below with the drawings. The same element in each embodiment below is marked as the same symbol.

FIG. 1 shows a block diagram of the configuration for a NAND type flash memory EEPROM according to an embodiment of the invention. FIG. 2 shows a circuit diagram of the configuration for the memory cell array 10 and the peripheral circuits in FIG. 1. First, the configuration for the NAND type flash EEPROM of the embodiment is described below.

In FIG. 1, the configuration for the NAND type flash EEPROM of the embodiment comprises a memory cell array 10, a control circuit 11 for controlling the action thereof, a row decoder 12, a high voltage generating circuit 13, a data rewriting and reading-out circuit 14, a column decoder 15, a command register 17, a address register 18, an action logic controller 19, a data input/output buffer 50, and a data input/output terminal 51.

In the memory cell array 10 as shown in FIG. 2, a NAND cell NU (NU0, NU1, . . . ) is configured by series connection of 16 stack-gate structured electrically rewritable non-volatile memory cell MC0~MC15. The drain end of each NAND cell NU is coupled to a bit line BL through the selective gate transistor SG1 and the source end of the same is coupled to a common source line CELSRC. The control gates of the memory cells MC arranged in the row direction are coupled to a common word line, and the gates of the selective transistor SG1, SG2 are coupled to the selective gate lines SGD, SGS arranged parallel to the word lines WL. One page, which is a unit of write-in or readout, is a range of the selected memory cell through one word line WL. One block, which is a unit of data erasing, is a range of a plurality of NAND cell NU of one page or its integer multiples. In order to carry out rewriting and reading out the data of the page unit, the rewriting and reading-out circuit 14 comprises a sense amplifier circuit (SA) and a latch circuit (DL), or so-called a page buffer.

The memory cell array 10 can have a simplified structure wherein a plurality of bit lines can share a page buffer. In this case, when writing in or reading out data, the number of bit lines which selectively connected to the page buffer is a unit of one page. FIG. 2 shows the range of the cell array within which data is inputted or outputted with one data input/output terminal 51. In order to select the word line WL of the memory cell array 10 and the bit line BL, the row decoder 12 and the column decode 15 are arranged respectively. The control circuit 11 carries out sequence control of data writing in, erasing, and reading out. The high voltage generating circuit 13 which is controlled by the control circuit boosted generates a high voltage or a middle voltage used for data writing in, erasing, and reading out.

The input/output buffer 50 is used for input/output of data and output of address signals. That is, data is transmitted between the input/output terminal 51 and the page buffer 14 through the input/output buffer 50 and the data line 52. The address signals inputted from the input/output terminal 51 are stored in the address register 18 and sent to the row decoder 12 and the column decoder 15 for decoding. The control command is also inputted from the input/output terminal 51. The inputted command is stored in the command register 17 after decoded and herewith the control circuit 11 is controlled. Such as chip enable signals CEB, command latch enable signals CLE, address latch enable signals ALE, write-in enable signals WEB, readout enable signals REB, and so on, the external control signals are taken out by the action logic controller 19, and the inner control signals corresponding to an action mode are generated. The inner control signals are used to control data latching or transmitting on the input/output buffer 50. Following, the data is transmitted to the control circuit 11 for action controlling.

The page buffer 14 has two latch circuits 14a, 14b, the structure of which is capable of carrying out switching between multi-value action function and cache function. That is, when one memory cell memorizes two value data of one bit, cache function is provided and when one memory cell memorizes four value data of two bits, cache function is provided and cache function is still effective even though limited by address.

Next, a structure of an improved page buffer 14 of a embodiment in the invention is described below. Note that the control circuit in FIG. 1 may be applied to data control of the page buffer 14.

FIG. 3(a) shows a block diagram of the configuration for the memory cell array 10 and the page buffer 14A according to the prior art; FIG. 3(b) shows a block diagram of the configuration for the memory cell array 10 and the page buffer 14 according to an embodiment of the invention. For simplification, the page buffer is marked as PB and the bit line is marked as BL in the later drawings.

As shown in FIG. 3(a), the page buffer 14A of the prior art, in the case of 16 bit lines, is formed by configuring 7 sets of the combination of the page buffer unit and the bit line selector. That is, a page buffer unit is configured for each bit line and the total necessary transistors are 296. In contrast, as shown in FIG. 3(b), the page buffer 14 of the embodiment is formed by a bit line selector 14s, a page buffer unit circuit 14u, and a latch circuit 14v-1. That is, a bit line selector 14s is configured for 16 bit lines to select, and the page buffer 14 of the embodiment is formed by that with a basic page buffer circuit 14*u* of the prior art and a latch circuit 14*v*-1. Note that the total transistors are 216, so the circuit size is substantially decreased. In the above example, the page buffer units are configured as 4 sets for 16 bit lines, but the page buffer units are able to be configured as 2 sets for 16 bit lines. Thus the total amount of the transistor is reduced to 169.

FIG. 4 shows a block diagram of the configuration for the page buffer 14 according to an embodiment of the invention. The page buffer unit circuit 14*u* in FIG. 4 comprises two latches L1, L2 coupled to the bit lines through the bit line selector 14*s*. Sense signals from the latch L1 are outputted to the column decoder 15. In this embodiment, in addition to the latch L2, the latches L3, L4, ... are coupled to between a line of a connecting point SNS and a bus B0 according to the increasing of the bit lines, and the bus B0 is used for transmitting the data of the latches L2, L3, L4, ... in a time division multiple way. For example, as a modification shows in FIG. 20, buses B0, B1, B2, ... are used to transmit the data of the latches L2. L3, L4, ..., respectively.

In the page buffer 14 shown in FIG. 4, for example, in the case that page size is set 2 KB and the size of each latch L1~L4 is set 1 KB, when reading out the 2 KB page data, the first half, 1 KB, are read out from the memory cell and the sense data thereof are transmitted to the latch L2, and then during the period that the data is transmitted to the bus B1 the sense data of the second half, 1 KB, are sheltered to the latch L3 through the connecting point SNS. Herewith the readout action is realized. With regard to this action, the action is described later. When programming the 2 KB page data to the memory cell, the first half, 1 KB, is stored into the lath L2 first and the programming action begins after the latch L2 is full filled, and during the period of the programming action the second half of the data, 1 KB, are sheltered to the latch L3 through the connecting point SNS. Herewith the programming action is realized. With regard to this action, the action is also described later.

FIG. 17 shows a condition chart of applying voltage to the bit line according to the prior art and the embodiment. Even though the configuration for the page buffer 14 is changed the same as that in the embodiment, the conditions of applying voltage to the bit line are not changed.

FIG. 18 shows an action timing chart of inputting/outputting of the data according to the prior art and the embodiment. It is known from FIG. 18 that time of inputting/outputting of the data becomes longer as the page size becomes larger, so the inner sense time can be ignored. In this case, we could try to use the buses B0, B1 in a time division multiple way to shorten the time of the action.

FIG. 5 show a circuit diagram of detailed configuration for the page buffer 14 in FIG. 4. It is noted that the latches L1, L2 of one bit are illustrated in FIG. 5 for a pair of bit lines, but the latches L1, L2 are distributed the size of 1 KB respectively for 16 bit lines in a real page buffer 14 (this embodiment).

In FIG. 5, a bit line selector 14*s* formed by 4 transistors Q1~Q4 is set for a pair of bit lines BL[0], BL[1]. When setting a latch circuit 14*v*-1 as the embodiment, a pair of bit lines BL[2], BL[3] can be added and the bit line selector 14*s* formed by 4 transistors Q1~Q4 is also set for these two added bit lines. When adding one more latch circuit 14*v*-2 (latch circuits for adding are allowed), a pair of bit lines BL[4], BL[5] can be added and the bit line selector 14*s* formed by 4 transistors Q1~Q4 is also set for these two added bit lines. In order to electrically connect a selected bit line to the page buffer unit circuit 14*u*, the transistors Q3, Q4 is a one-side-opened switch for selecting a bit line. In order to electrically connect an unselected bit line to the ground VIRPWR, the transistors Q1, Q2 are a one-side-opened switches for selecting a bit line.

The page buffer unit circuit 14*u* which is a well-known circuit comprises two latches L1, L2 formed by two inverters and eleven transistors Q11~Q21. Herein the transistor Q11 is a switch for switching the bit line and the page buffer unit circuit connected or disconnected; the transistor Q12 is a transistor for controlling voltage; the transistors Q14, Q19, Q20, and Q21 are transistors for controlling data transmission. The circuit 14*u* between the latches L1, L2 is able to transmit data through the connecting point SNS.

The latch circuit 14*v*-1 comprises a latch L3 formed by 2 inverters and transistors Q41~Q43 for data transmission. The latch L2 and the latch L3 can transmit data to each other. The latch circuit 14*v*-2 for adding comprises a latch L4 formed by 2 inverters and transistors Q51~Q53 for data transmission. The latch L2 and the latch L4 can transmit data to each other. Further adding latches L5, L6 is also allowed.

FIG. 19 shows a chart of size of each latch L1~L5 according to the prior art, the embodiment, and the modification example. In FIG. 19, in the case that the size of the page buffer 14 of the embodiment becomes one half of that in the prior art, the size of each latch L1~L5 is 1 KB. In modification example, in the case that the size of the page buffer 14 becomes a quarter of that in the prior art, each latch L1~L5 is 512 B. It is well-known from FIG. 19 that the size of the latches L2~L5 is the same. For example, in the case that 2 KB page data is divided to 16 divisions, the latches behind the latch L2 (the latch L2 is also included) need 16 latches.

Next, the readout and programming sequence of a NAND type flash EEPROM using the page buffer 14 according the embodiment is described bellow.

Embodiment 1

FIG. 6(*a*) shows an electrical data pattern A (page size is 2 KB) according to the prior art; FIG. 6(*b*) shows a timing chart of the data readout sequence in FIG. 6(*a*). FIG. 11 shows a detailed timing chart of the data readout sequence of the prior art corresponding to FIG. 6(*b*). In the FIG. 11, the symbol "*" indicates that the electrical charge of bit lines does not become 0 unless being discharged in practice.

In FIG. 6(*a*), the 2 KB page data is not divided, which is composed of one data A. In the readout sequence of FIG. 6(*b*), the data of the connecting point SNS and the latches L1, L2 are shown. In the readout sequence, the data A is sensed first, and then after the data of the connecting point SNS is transmitted to the latch L1, the data A is transmitted to the latch L2. The data A is outputted. In the readout sequence of FIG. 11, the bit line is pre-charged after formatting, and then after discharging the data is sensed and outputted from the memory cell. Herein the action time to read out 2 KB data is represented by the formula below.

Readout action time = (1)

30 $\mu$ sec × 1(sense time) + 60 $\mu$ sec × 1(data output time) +

100 nsec × 2(data control time) = 90.2 $\mu$ sec

FIG. 7(*a*) shows an electrical data pattern A, B(page size is 1 KB+1 KB) according to an embodiment of the invention 1; FIG. 7(*b*) shows a timing chart of the data readout sequence in FIG. 7(*a*). FIG. 12 shows a detailed timing chart of the data readout sequence of the embodiment 1 corresponding to FIG.

7(b). In the FIG. 12, the symbol "*" indicates that the electrical charge of bit lines does not become 0 unless being discharged in practice.

In FIG. 7(a), the 2 KB page data is composed of two divided data A, B. In the readout sequence of FIG. 7(b), the data of the connecting point SNS and the latches L1, L2, L3 are shown. In the readout sequence, the data A is sensed first, and then after the data of the connecting point SNS is transmitted to the latch L1, the data A is transmitted from the latch L1 to the latch L2. The data A is outputted. At the same time, the data B is sensed, and then after the data B of the connecting point SNS is transmitted to the latch L1, the data B is transmitted from the latch L1 to the latch L3. After that, the data B is outputted. As described above, the output of the data A and the sense of the data B are able to proceed at the same time in the embodiment 1.

In the readout sequence of FIG. 12, compared with the example of FIG. 11, one page buffer senses two bit lines BL[0], BL[2] as two different times. In the prior art of FIG. 11, without the latch L3, after the readout of the bit line BL[0] is accomplished, the readout action of the bit line BL[2] is not started until the data output of the latch L2 is finished. However in the embodiment 1, by the arrangement of the latch L3, the output of the data A and the output of the data B can proceed at the same time. Herein the action time to read out 2 KB data is represented by the formula below.

$$\text{Readout action time} = \qquad (2)$$
$$30\ \mu\ \sec \times 3(\text{sense time and data output time}) +$$
$$100\ \text{nsec} \times 4(\text{data control time}) = 90.4\ \mu\ \sec$$

By comparing the action time of Formula (1) and Formula (2), it is known that the action time is substantially the same.

FIG. 13 shows a detailed timing chart of one-lump readout sequence according to the modification of the embodiment 1. In the FIG. 13, the symbol "*" indicates that the electrical charge of bit lines does not become 0 unless being discharged in practice.

In the one-lump readout sequence of FIG. 13, it is characterized that one page buffer senses two bit lines BL[0], BL[2] in one time. It is known from FIG. 13 that format, pre-charge, and sense of the bit line proceed at the same time for two bit lines BL[0], BL[2]. In the one-lump readout sequence, the action becomes complicated, but pre-charge/discharge of the bit line which occupies most time of the action can be finished in one time.

Embodiment 2

FIG. 8(a) shows an electrical data pattern A (page size is 2 KB) according to the prior art; FIG. 8(b) shows a timing chart of the data programming sequence in FIG. 8(a). FIG. 14 shows a detailed timing chart of the data programming sequence of the prior art corresponding to FIG. 8(b). In FIG. 14, in order to describe programming control, programming data input and verifying to the latch L2, L3 are abbreviated.

In FIG. 8(a), the 2 KB page data is not divided, which is composed of one data A. In the programming sequence of FIG. 8(b), the data of the connecting point SNS and the latches L1, L2 are shown. In the programming sequence, the data A is inputted into the latch L2 first, and then after the data A in the latch L2 is transmitted to the latch L1, the data in the latch L1 is reversed (the reverse process can proceed at an outer circuit in advance, and the following description is the same). Then in order to program the programming data A, stressing process and verifying process proceed. As shown in the programming sequence of FIG. 14, pre-charging, data transmission, and programming proceed after the data is inputted. Herein the action time to program 2 KB data is represented by the formula below.

$$\text{Programming action time} = 60\ \mu\ \sec \times 1(\text{data input time}) + \qquad (3)$$
$$300\ \mu\ \sec \times 1(\text{stressing of programming and verifying time}) +$$
$$100\ \text{nsec} \times 2(\text{data control time}) = 360.2\ \mu\ \sec$$

FIG. 9(a) shows an electrical data pattern A, B(page size is 1 KB+1 KB) according to an embodiment of the invention 2; FIG. 9(b) shows a timing chart of the data programming sequence in FIG. 9(a). FIG. 15 shows a detailed timing chart of the data programming sequence of the embodiment 2 corresponding to FIG. 9(b). In FIG. 15, in order to describe programming control, input and verifying of programming data to the latch L2, L3 are abbreviated.

In FIG. 9(a), the 2 KB page data is composed of two divided data A, B. In the programming sequence of FIG. 9(b), the programming data A is inputted into the latch L2, and then after the data A in the latch L2 is transmitted to the latch L1, the data in the latch L1 is reversed. Then in order to use the data A for programming, while pressing process and verifying process proceed, the programming data B is inputted into the latch L3 at the same time. Then after data in the latch L3 is transmitted into the latch L1, the data in the latch L1 is reversed. In order to use the data B for programming, stressing process and verifying process proceed. As described above, the programming of the data A and the input of the data B are able to proceed at the same time in the embodiment 2.

In the programming sequence of FIG. 15, compared with the example of FIG. 14, one page buffer programs two bit lines BL[0], BL[2] as two different times. In the programming process of each bit line in FIG. 15, data input, pre-charging, data transmission, stressing of programming proceed in order. Therefore, in the prior art of FIG. 14, without the latch L3, after the programming of the bit line BL[0] is accomplished, the programming action of the bit line BL[2] is not started until the data input of the latch L2 is finished. However in the embodiment 2, by the arrangement of the latch L3, the programming of the data A and the input of the data B can proceed at the same time. Herein the action time to program 2 KB data is represented by the formula below.

$$\text{Programming action time} = 30\ \mu\ \sec \times 1(\text{data input time}) + \qquad (4)$$
$$300\ \mu\ \sec \times 2(\text{stressing of program and verifying time}) +$$
$$100\ \text{nsec} \times 4(\text{data control time}) = 660.4\ \mu\ \sec$$

By comparing the action time of Formula (3) and Formula (4), it is known that the embodiment 2 needs action time which is double over the prior art because of the divided programming.

Embodiment 3

FIG. 10(a) shows an electrical data pattern A, B (page size is 1 KB+1 KB) according to an embodiment of the invention 3; FIG. 10(b) shows a timing chart of the data programming sequence in FIG. 10(a). FIG. 16 shows a detailed timing chart of the data programming sequence of the embodiment 3 corresponding to FIG. 10(b). In contrast to the divided programming in the embodiment 2, the embodiment is an example of one-lump write-in. In FIG. 16, in order to describe programming control, input and verifying of programming data to the latch L2, L3 are abbreviated.

In FIG. 10(a), the 2 KB page data is composed of two divided data A, B. In the programming sequence of FIG. 10(b), the programming data A is inputted into the latch L2, and then after the data A in the latch L2 is transmitted to the latch L1, the data in the latch L1 is reversed. While setting the data to the bit line, the programming data B is inputted into the latch L3 at the same time. Then after data in the latch L3 is transmitted into the latch L1, the data in the latch L1 is reversed and the data B is set to the bit line. In order to use the programming data A, B for programming, stressing process and verifying process proceed at the same time. As described above, two data are able to proceed at the same time in the embodiment 3.

In the programming sequence of FIG. 16, compared with the embodiment 2 of FIG. 15, one page buffer programs two bit lines BL[0], BL[2] in order. In FIG. 16, data input, precharging, data transmission, stressing of programming proceed in order. The action of embodiment 3 is more complicated than that of the embodiment 2, but pressing process of the bit line which occupies most time of the action can be finished in one time. Herein the action time to program 2 KB data is represented by the formula below.

Programming action time = (5)

30 $\mu$ sec × 1(data input time) + (10 $\mu$ sec × 2 + 20 $\mu$ sec × 1)

(data setting and input to the bit line) +

300 $\mu$ sec × 1(stressing of program and verifying time) +

100 nsec × 4(data control time) = 370.4 $\mu$ sec

By comparing the action time of Formula (4) and Formula (5), it is known that the action time of the embodiment 3 substantially decreases in comparison with that of the embodiment 2. By comparing the action time of Formula (3) and Formula (5), the action time of the embodiment 3 is almost the same as that of the prior art.

As described above, Within a page buffer 14 according to an embodiment of the invention which is coupled to a non-volatile memory cell array 10 and temporally stores data as the data with a predetermined page unit is written in and read out to/from the memory cell array 10, at least one latch circuit 14v-1 including a bit line selector 14s, a page buffer unit circuit 14u including two latch L1-L2, and a latch L3 is set up for a plurality of bit lines. The bit line selector 14s selects one bit line and couples it to the page buffer unit circuit 14u. The latch L1 temporally stores the data which are read out from the memory cell of the selected bit line, and then outputs the data through the latch L2 or L3. On the other hand, the latch L1 temporally stores the programming data inputted through the latch L2 or L3, and after that transverses the programming data and outputs it to the memory cell of the selected bit line for programming. Therefore, in comparison with the prior art, the invention can substantially reduce the size of the page buffer circuit within almost the same action time.

[Possibility of Industry Utilizing]

As the detailed description above, according to the page buffer circuit for electrically rewritable non-volatile semiconductor memory device and the control circuit thereof, at least one latch circuit including a bit line selector, a page buffer unit circuit including a first latch and a second latch, and a third latch is set up for a plurality of bit lines, so in comparison with the prior art, the invention can substantially reduce the size of the page buffer circuit within almost the same action time.

Brief Description of the Drawings

FIG. 6(a) shows an electrical data pattern A(page size is 2 KB) according to the prior art. FIG. 6(b) shows a timing chart of the data readout sequence in FIG. 6(a).

FIG. 7(a) shows an electrical data pattern A, B (page size is 1 KB+1 KB) according to an embodiment of the invention 1. FIG. 7(b) shows a timing chart of the data readout sequence in FIG. 7(a).

FIG. 17 shows a condition chart of applying voltage to the bit line according to the prior art and the embodiment.

FIG. 18 shows an action timing chart of inputting/outputting of the data according to the prior art and the embodiment.

FIG. 19 shows a chart of size of each latch L1~L5 according to the prior art, the embodiment, and the modification example.

Figure 1:
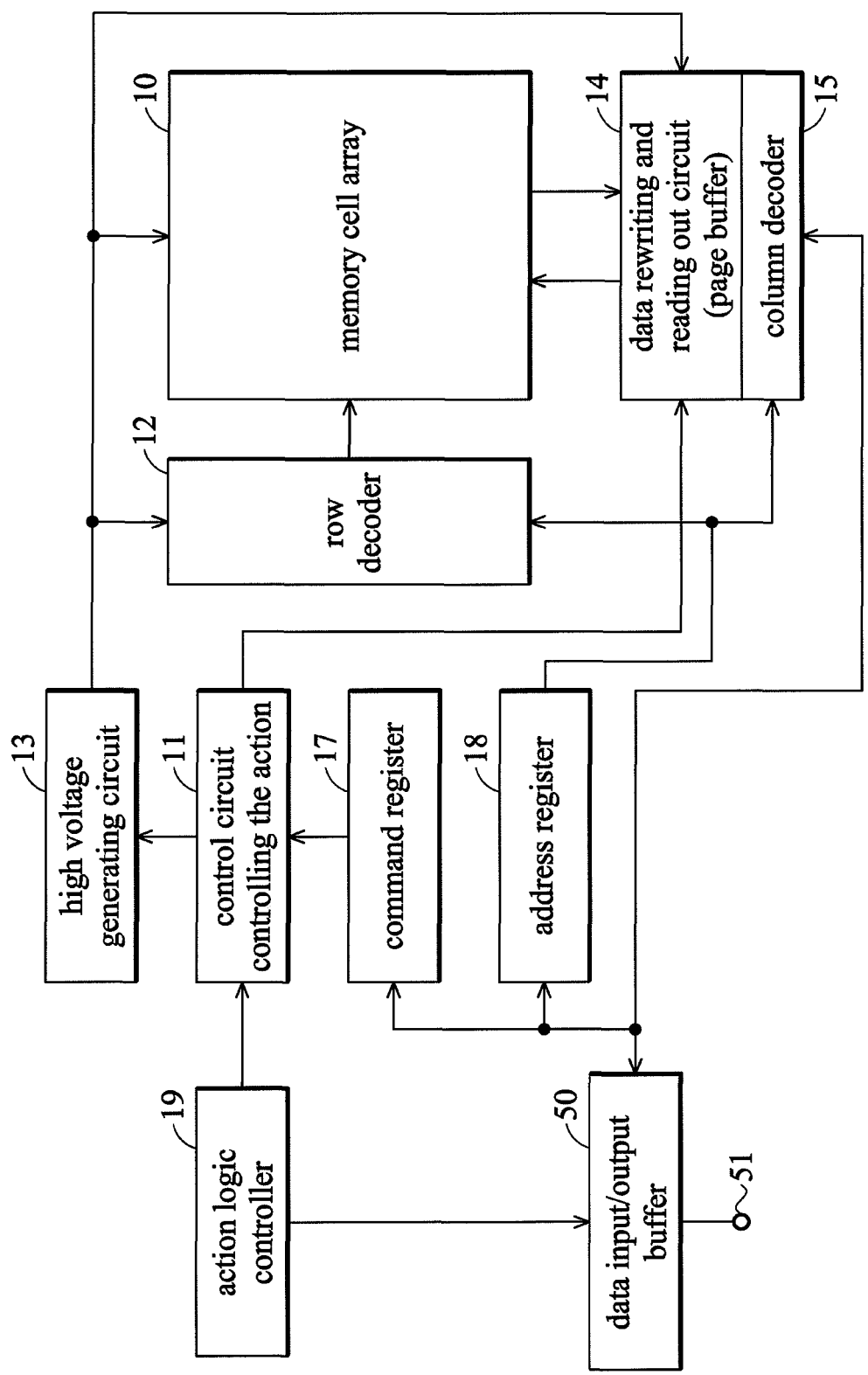
FIG. 1 shows a block diagram of the configuration for a NAND type flash memory EEPROM according to an embodiment of the invention.
Figure 2:
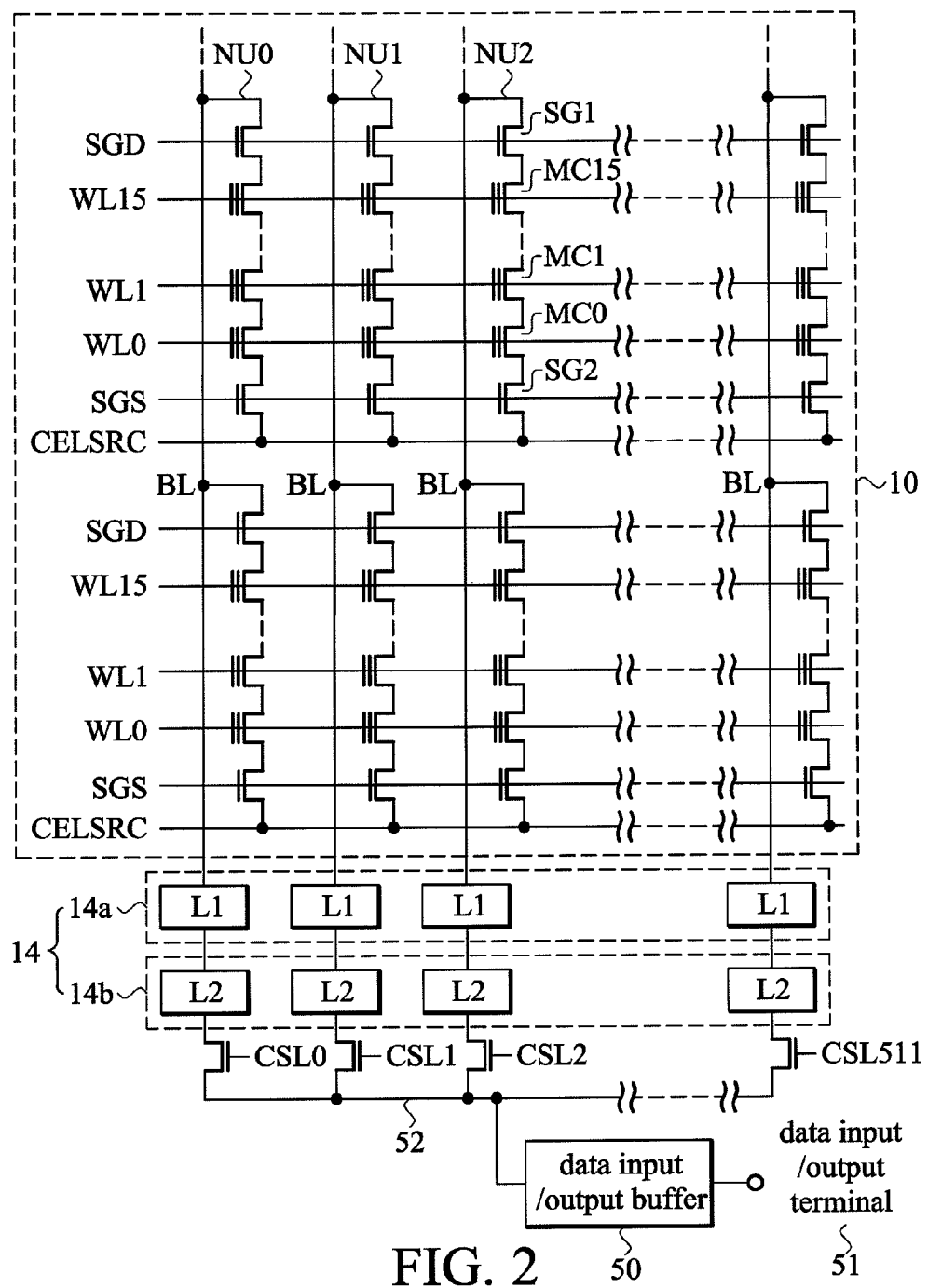
FIG. 2 shows a circuit diagram of the configuration for the memory cell array 10 and the peripheral circuits in FIG. 1.
Figure 3:
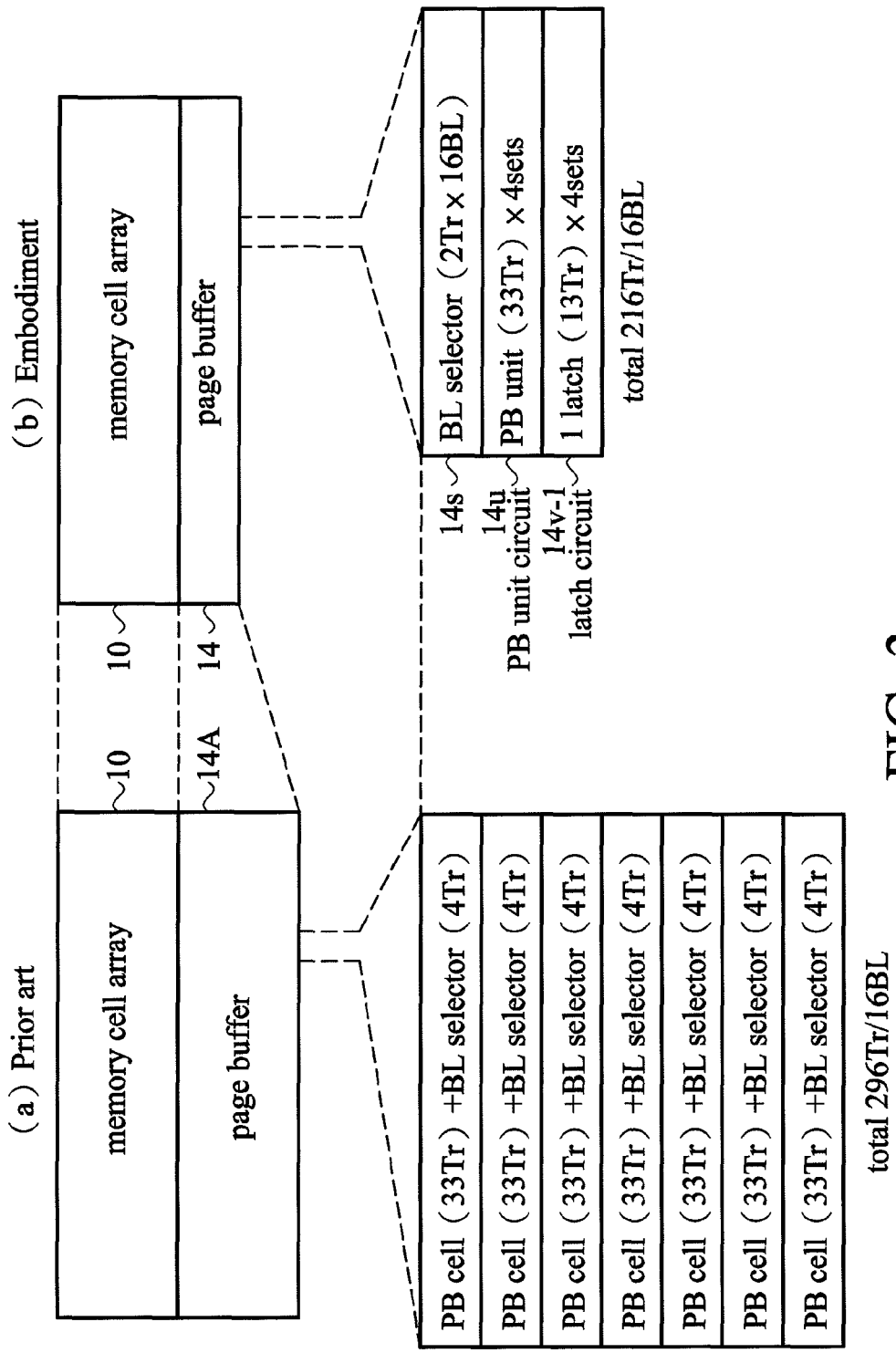
FIG. 3(a) shows a block diagram of the configuration for the memory cell array 10 and the page buffer 14A according to the prior art.
FIG. 3(b) shows a block diagram of the configuration for the memory cell array 10 and the page buffer 14 according to an embodiment of the invention.
Figure 4:
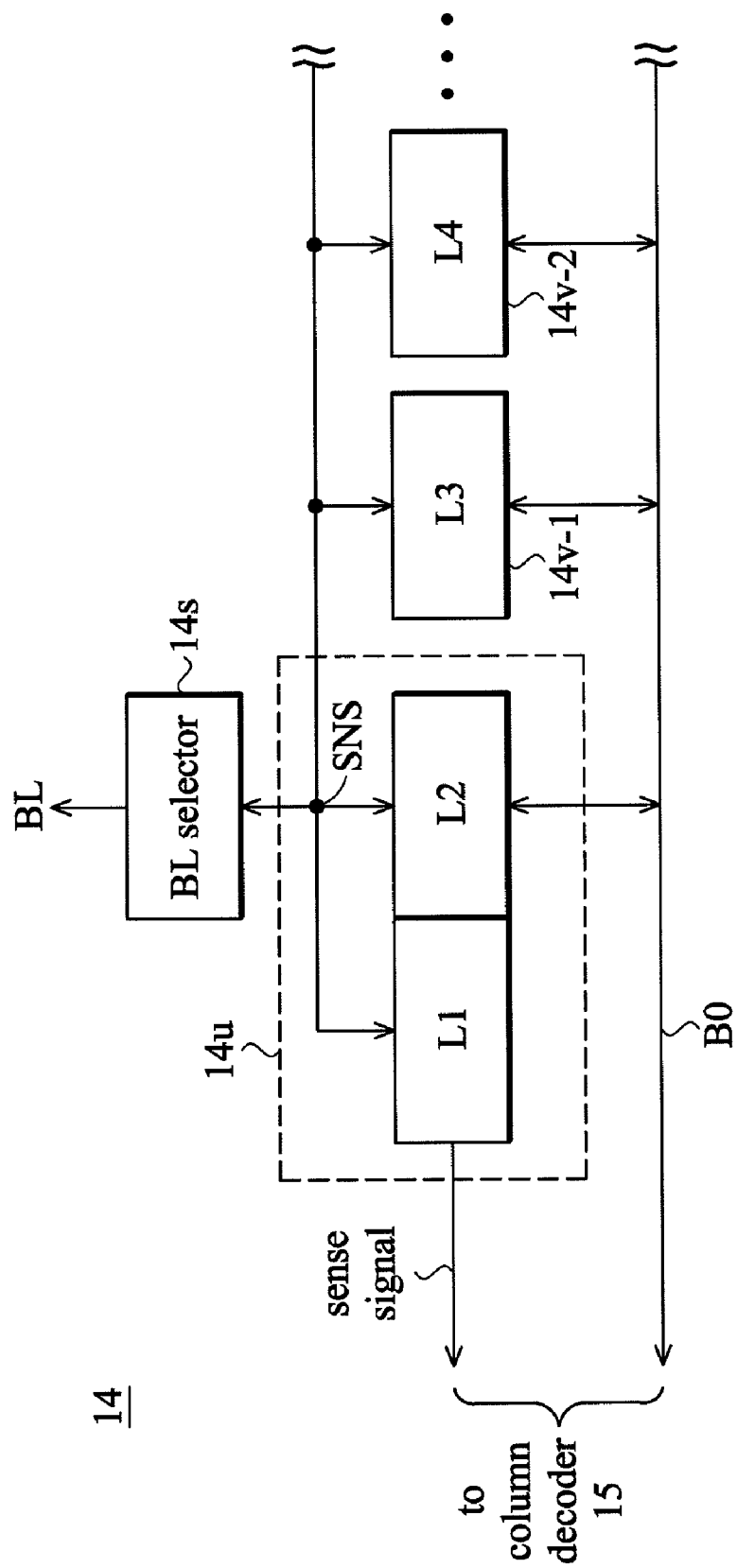
FIG. 4 shows a block diagram of the configuration for the page buffer 14 according to an embodiment of the invention.
Figure 5:
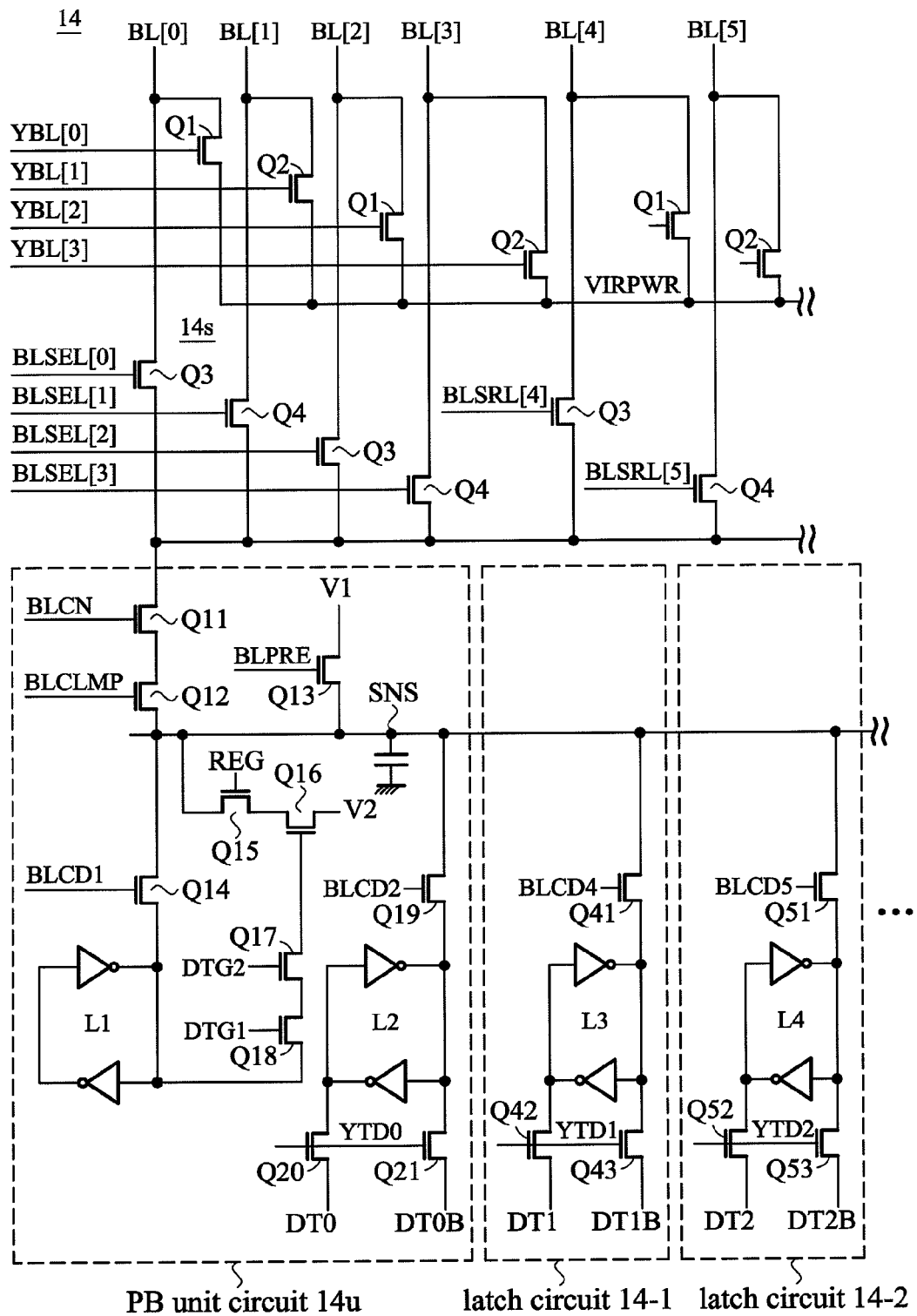
FIG. 5 show a circuit diagram of detailed configuration for the page buffer 14 in FIG. 4.
Figure 8:
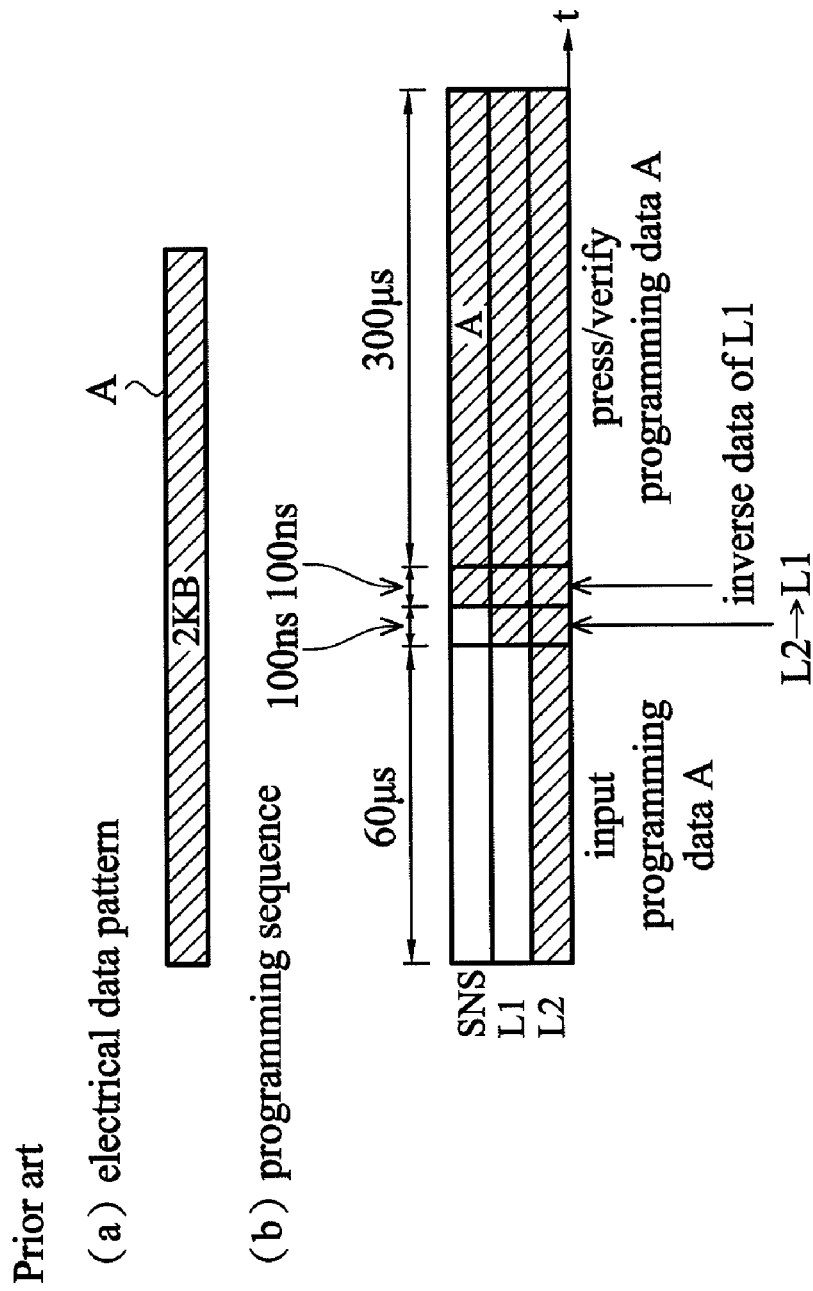
FIG. 8(a) shows an electrical data pattern A (page size is 2 KB) according to the prior art.
FIG. 8(b) shows a timing chart of the data programming sequence in FIG. 8(a).
Figure 9:
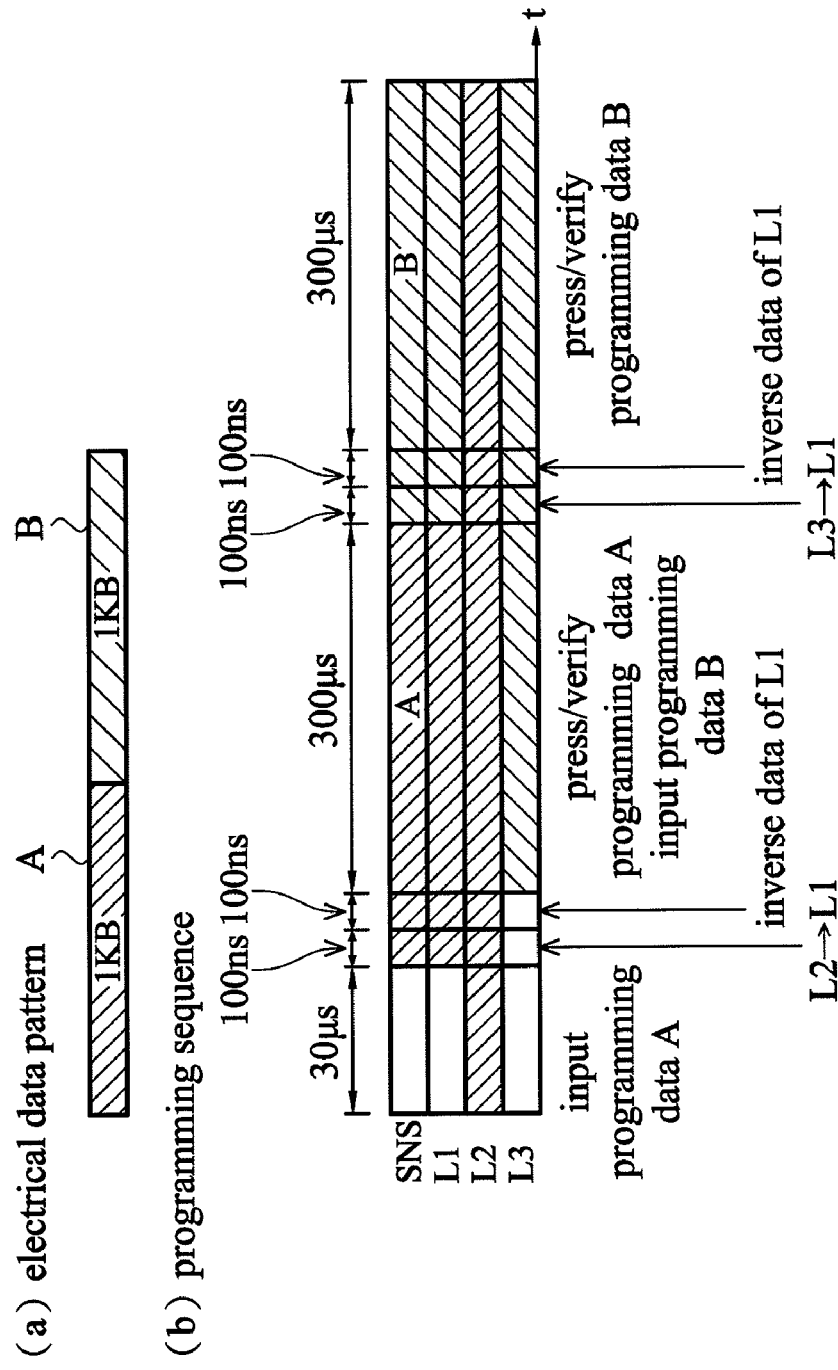
FIG. 9(a) shows an electrical data pattern A, B (page size is 1 KB+1 KB) according to an embodiment of the invention 2.
FIG. 9(b) shows a timing chart of the data programming sequence in FIG. 9(a).
Figure 10:
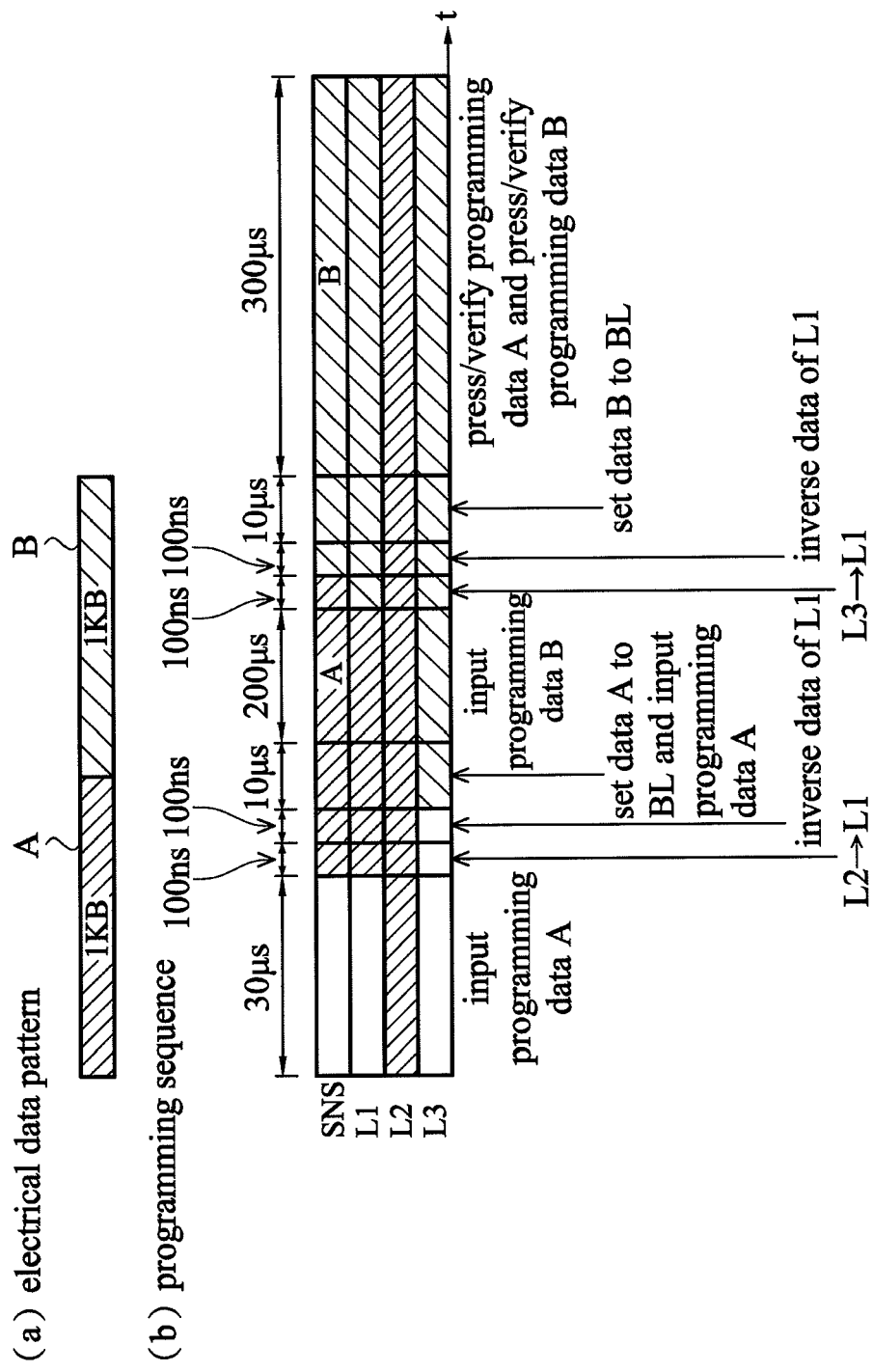
FIG. 10(a) shows an electrical data pattern A, B (page size is 1 KB+1 KB) according to an embodiment of the invention 3.
FIG. 10(b) shows a timing chart of the data programming sequence in FIG. 10(a).
Figure 11:
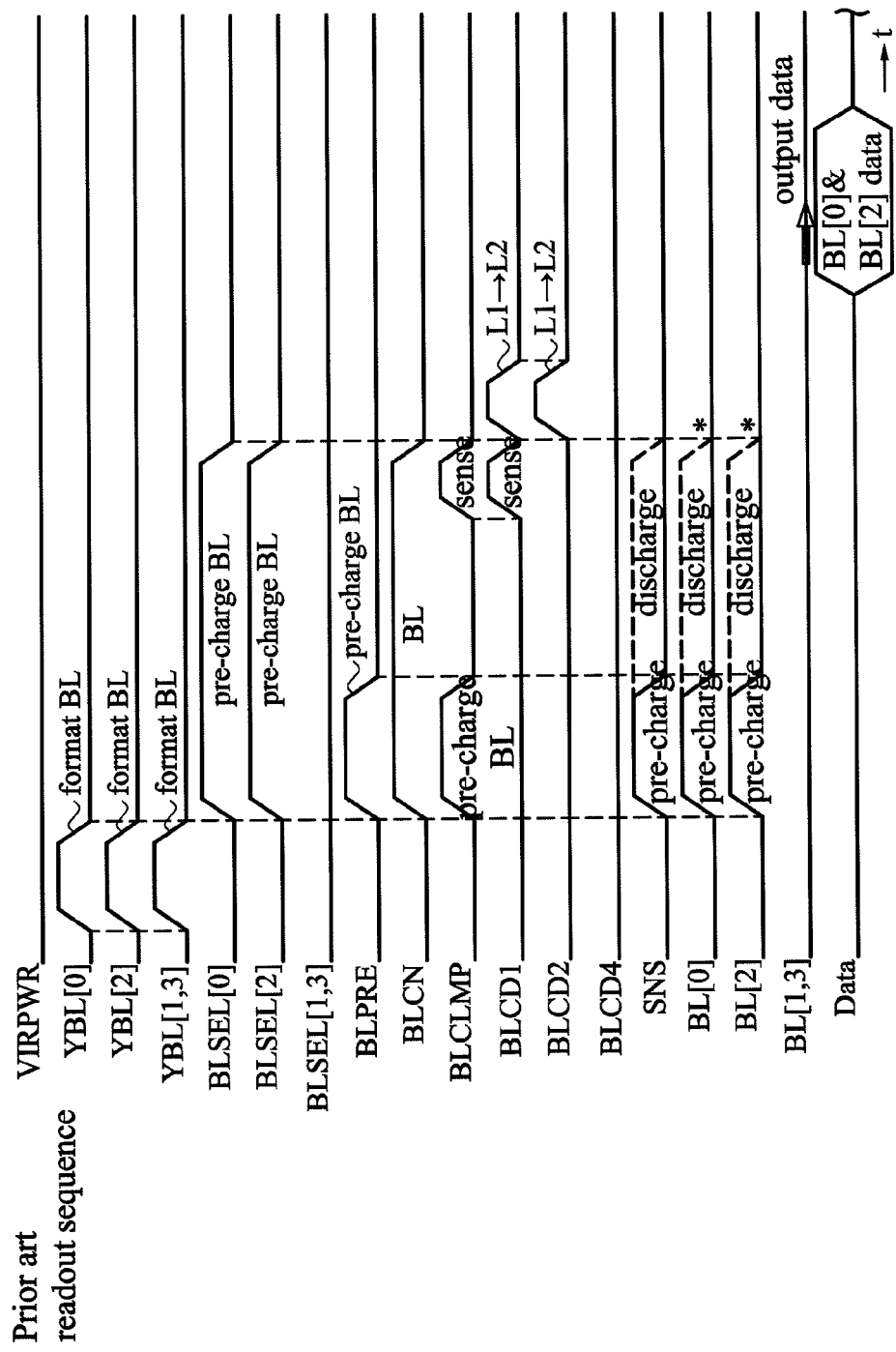
FIG. 11 shows a detailed timing chart of the data readout sequence of the prior art corresponding to FIG. 6(b).
Figure 12:
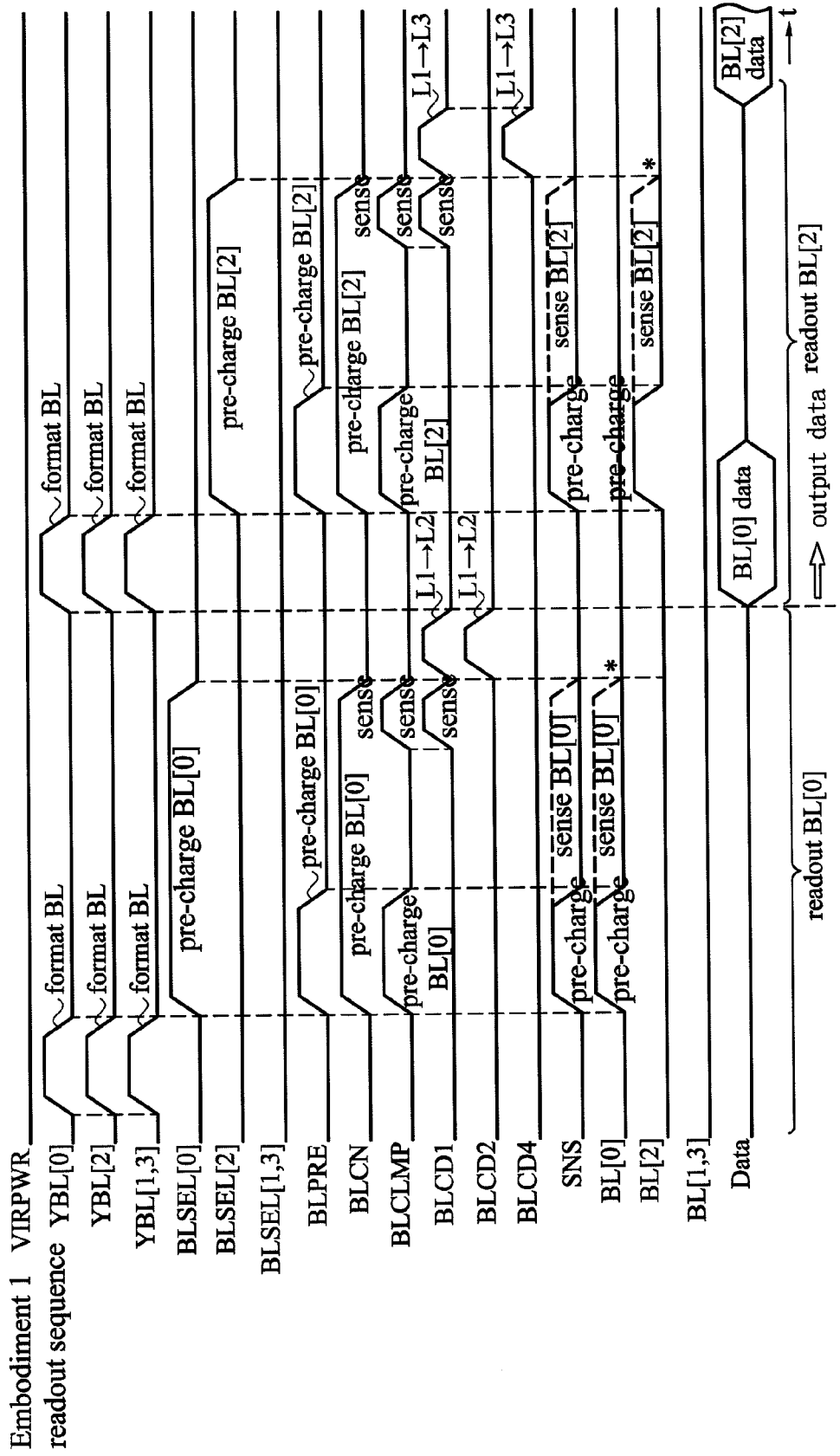
FIG. 12 shows a detailed timing chart of the data readout sequence of the embodiment 1 corresponding to FIG. 7(b).
Figure 13:
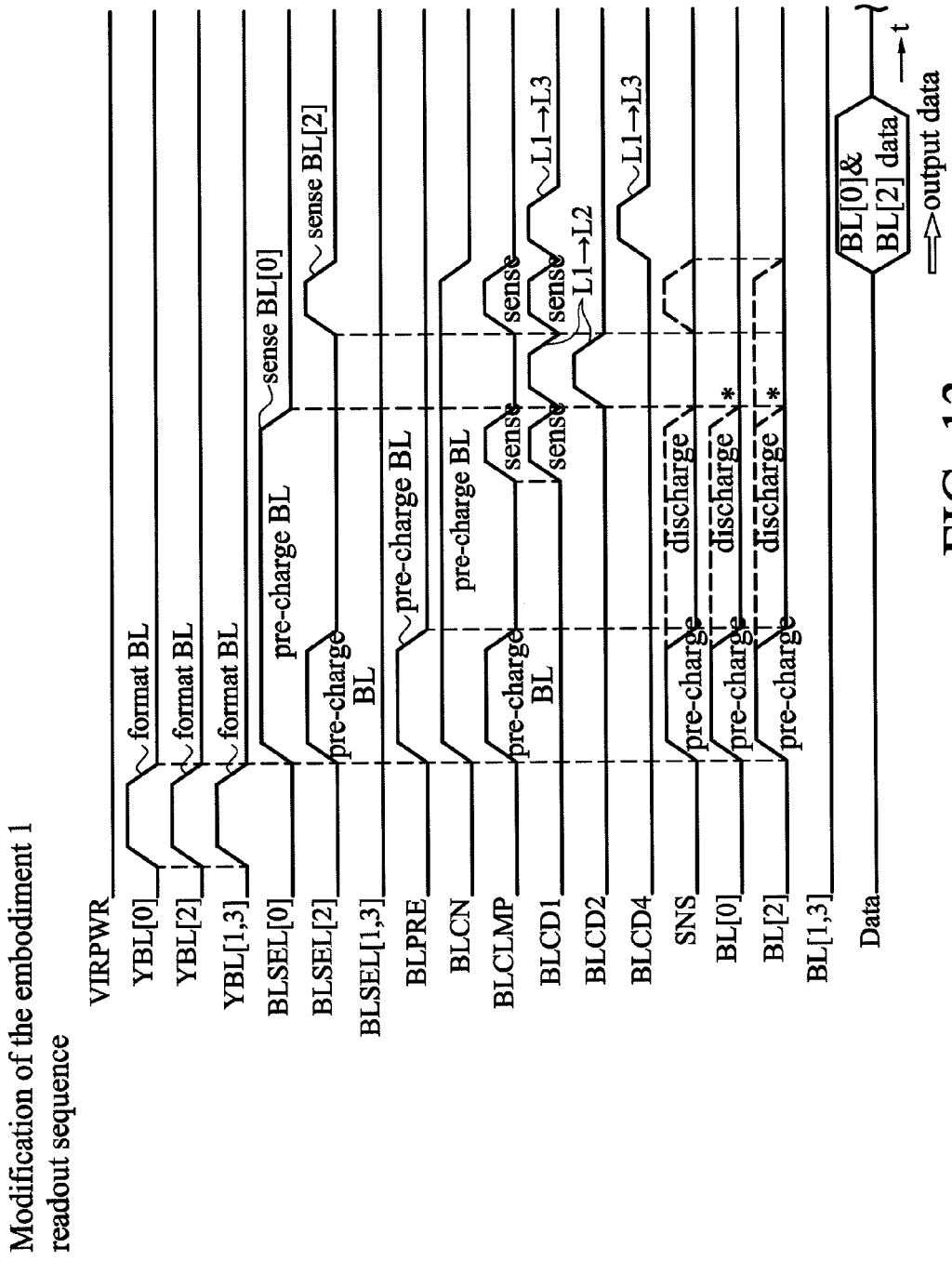
FIG. 13 shows a detailed timing chart of one lump readout sequence according to the modification example of the embodiment 1.
Figure 14:
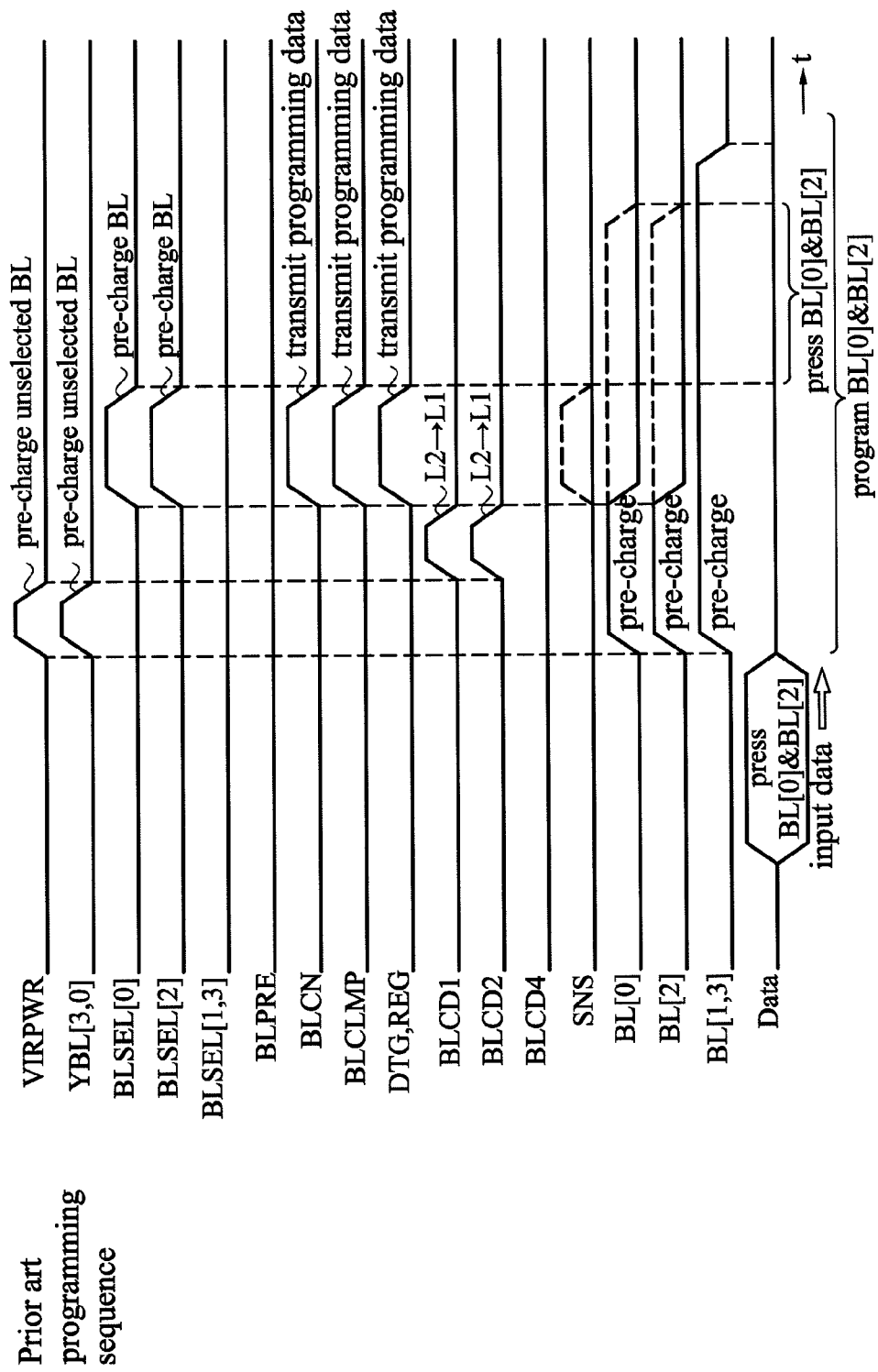
FIG. 14 shows a detailed timing chart of the data programming sequence of the prior art corresponding to FIG. 8(b).
Figure 15:
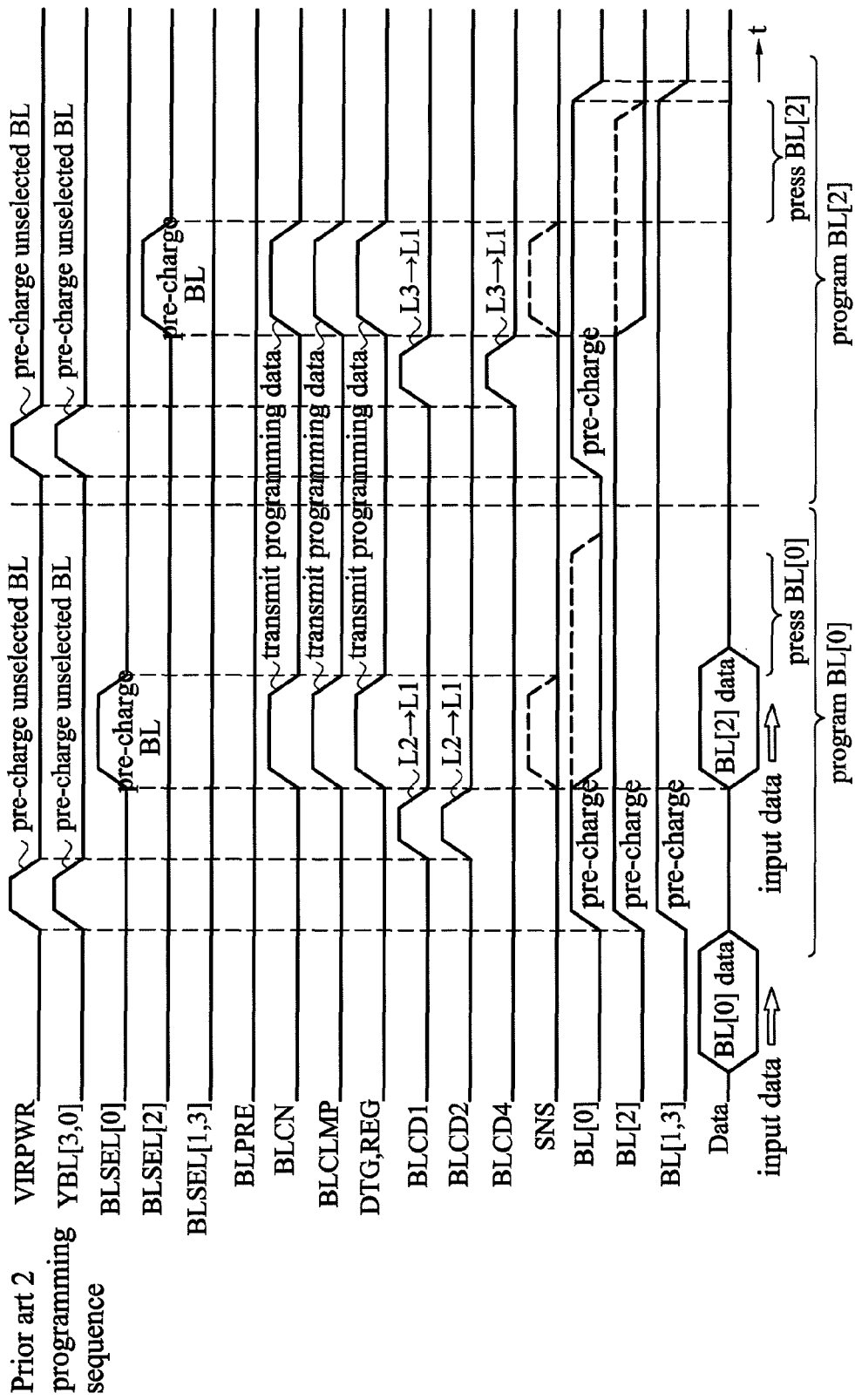
FIG. 15 shows a detailed timing chart of the data programming sequence of the embodiment 2 corresponding to FIG. 9(b).
Figure 16:
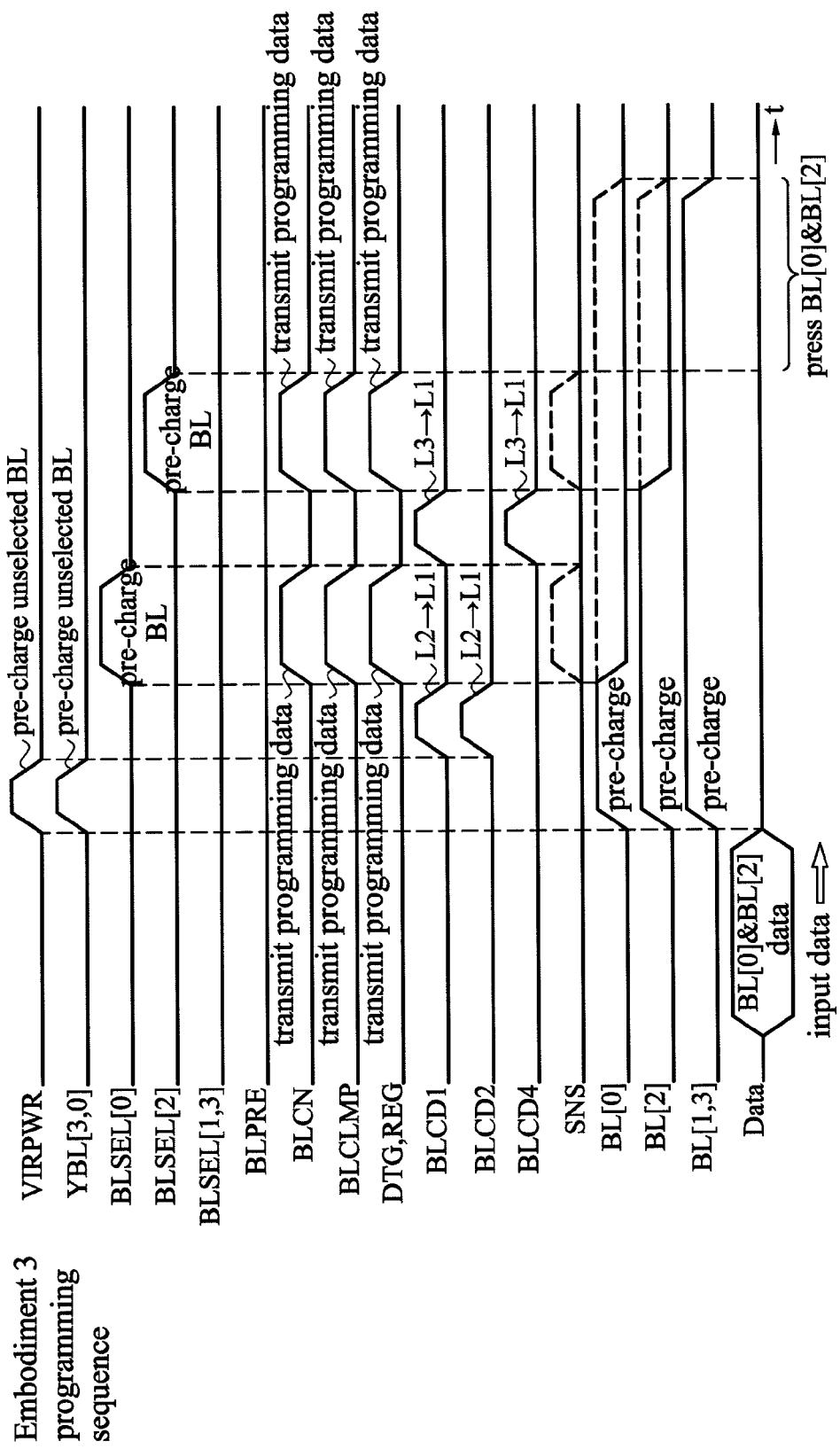
FIG. 16 shows a detailed timing chart of the data programming sequence of the embodiment 3 corresponding to FIG. 10(b).
Figure 20:
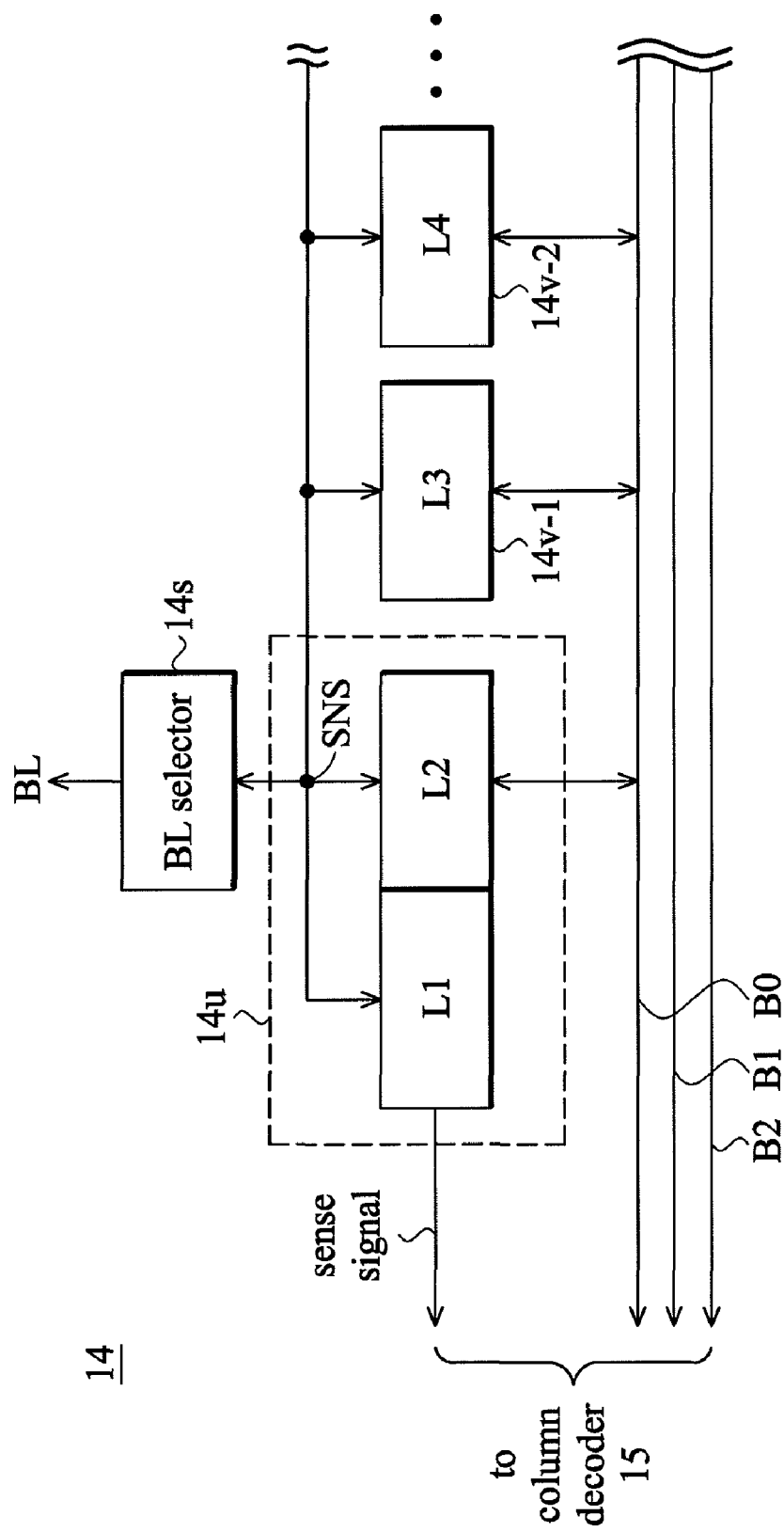
FIG. 20 shows a block diagram of the configuration for the page buffer 14 which is a modification example replacing the configuration for FIG. 4.

The invention claimed is:

1. A page buffer circuit for a non-volatile semiconductor memory device which is coupled to a non-volatile memory cell array and temporally stores data as the data with a predetermined page unit is written in and read out to/from the memory cell array, comprising:
   at least one latch circuit including a bit line selector, a page buffer unit circuit including a first latch and a second latch, and a third latch, set up for a plurality of bit lines, wherein the bit line selector selects one of the plurality of bit lines and couples it to the page buffer unit circuit; and
   a control circuit, wherein the control circuit controls so that the first latch temporally stores the data which is read out from the memory cell of the selected bit line, and then outputs the data through the second latch or the third latch; on the other hand, the first latch temporally stores the programming data inputted through the second latch or the third latch, and after that outputs it to the memory cell of the selected bit line for programming.

2. The page buffer circuit for a non-volatile semiconductor memory device of claim 1, wherein the control circuit performs outputting a first data read out from the memory cell of the selected bit line from the first latch to the second latch and sensing a second data from a memory cell of the next selected bit line at the same time.

3. The page buffer circuit for a non-volatile semiconductor memory device of claim 1, wherein the control circuit performs outputting a stored first programming data from the first latch to the memory cell of the selected bit line for programming and inputting an inputted second programming data to the third latch at the same time.

4. The page buffer circuit for a non-volatile semiconductor memory device of claim 1, wherein the control circuit performs programming a first programming data and a second programming data at the same time after the stored first programming data is set to the selected bit line and the stored second programming data is set to the next selected bit line.

5. A control method of a page buffer circuit for a non-volatile semiconductor memory device, wherein the page buffer circuit is coupled to a non-volatile memory cell array and temporally stores data as the data with a predetermined page unit is written in and read out to/from the memory cell array, comprising:
   setting at least one latch circuit including a bit line selector, a page buffer unit circuit including a first latch and a second latch, and a third latch, for a plurality of bit lines, wherein the bit line selector selects one of the plurality of bit lines and couples it to the page buffer unit circuit;
   controlling so that the first latch temporally stores the data which is read out from the memory cell of the selected bit line, and then outputs the data through the second latch or the third latch; on the other hand, the first latch temporally stores the programming data inputted through the second latch or the third latch, and after that outputs it to the memory cell of the selected bit line for programming.

6. The control method of a page buffer circuit for a non-volatile semiconductor memory device of claim 5, wherein outputting a first data read out from the memory cell of the selected bit line from the first latch to the second latch and sensing a second data from a memory cell of the next selected bit line at the same time.

7. The control method of a page buffer circuit for a non-volatile semiconductor memory device of claim 5, wherein outputting a stored first programming data from the first latch to the memory cell of the selected bit line for programming and inputting an inputted second programming data to the third latch at the same time.

8. The control method of a page buffer circuit for a non-volatile semiconductor memory device of claim 5, wherein programming a first programming data and a second programming data at the same time after the stored first programming data is set to the selected bit line and the stored second programming data is set to the next selected bit line.

* * * * *